US008112725B2

(12) United States Patent
Tsutsui

(10) Patent No.: US 8,112,725 B2
(45) Date of Patent: Feb. 7, 2012

(54) WRITING PATTERN PRODUCING METHOD, PHOTOMASK MANUFACTURING METHOD, AND SEMICONDUCTOR DEVICE MANUFACTURING METHOD

(75) Inventor: Tomohiro Tsutsui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 12/562,138

(22) Filed: Sep. 18, 2009

(65) Prior Publication Data

US 2010/0075235 A1 Mar. 25, 2010

(30) Foreign Application Priority Data

Sep. 19, 2008 (JP) ................................ 2008-240873

(51) Int. Cl.
*G06F 17/50* (2006.01)
(52) U.S. Cl. ........................................... 716/50; 716/55
(58) Field of Classification Search .............. 716/50–55; 382/144–145
See application file for complete search history.

(56) References Cited

U.S. PATENT DOCUMENTS

| 7,222,327 | B2 * | 5/2007 | Tsutsui et al. | ..................... 430/5 |
| 7,735,055 | B2 * | 6/2010 | Tsutsui et al. | ................... 716/50 |
| 2006/0206853 | A1 * | 9/2006 | Kamo et al. | ..................... 716/19 |

FOREIGN PATENT DOCUMENTS

| JP | 2000-112113 | 4/2000 |
| JP | 2000-187314 | 7/2000 |
| JP | 2000-511303 | 8/2000 |
| JP | 2001-313253 | 11/2001 |
| JP | 2002-141258 | 5/2002 |
| JP | 2002-343702 | 11/2002 |
| JP | 2003-043664 | 2/2003 |
| JP | 2005-079112 | 3/2005 |
| JP | 2006-227407 | 8/2006 |

OTHER PUBLICATIONS

Notice of Reasons for Rejection, issued by Japanese Patent Office, mailed on Oct. 26, 2010, in a Japanese counterpart application No. 2008-240873 (2 pages).

* cited by examiner

*Primary Examiner* — Stacy Whitmore
(74) *Attorney, Agent, or Firm* — Finnegan, Henderson, Farabow, Garrett & Dunner, L.L.P.

(57) ABSTRACT

A writing pattern producing method includes obtaining a width of an overlapping portion of first and second patterns, determining whether the width of the overlapping portion is greater than a predetermined width, producing a writing pattern according to a first method when the width of the overlapping portion is determined to be greater than the predetermined width, producing a writing pattern according to a second method when the width of the overlapping portion is determined to be smaller than the predetermined width, the first method being to produce the writing pattern by dividing a composite pattern of the first and second patterns into a plurality of graphic forms which have widths not smaller than the predetermined width and do not overlap with one another, and the second method being to produce the writing pattern from the first and second patterns so that the overlapping portion is written repeatedly.

15 Claims, 7 Drawing Sheets

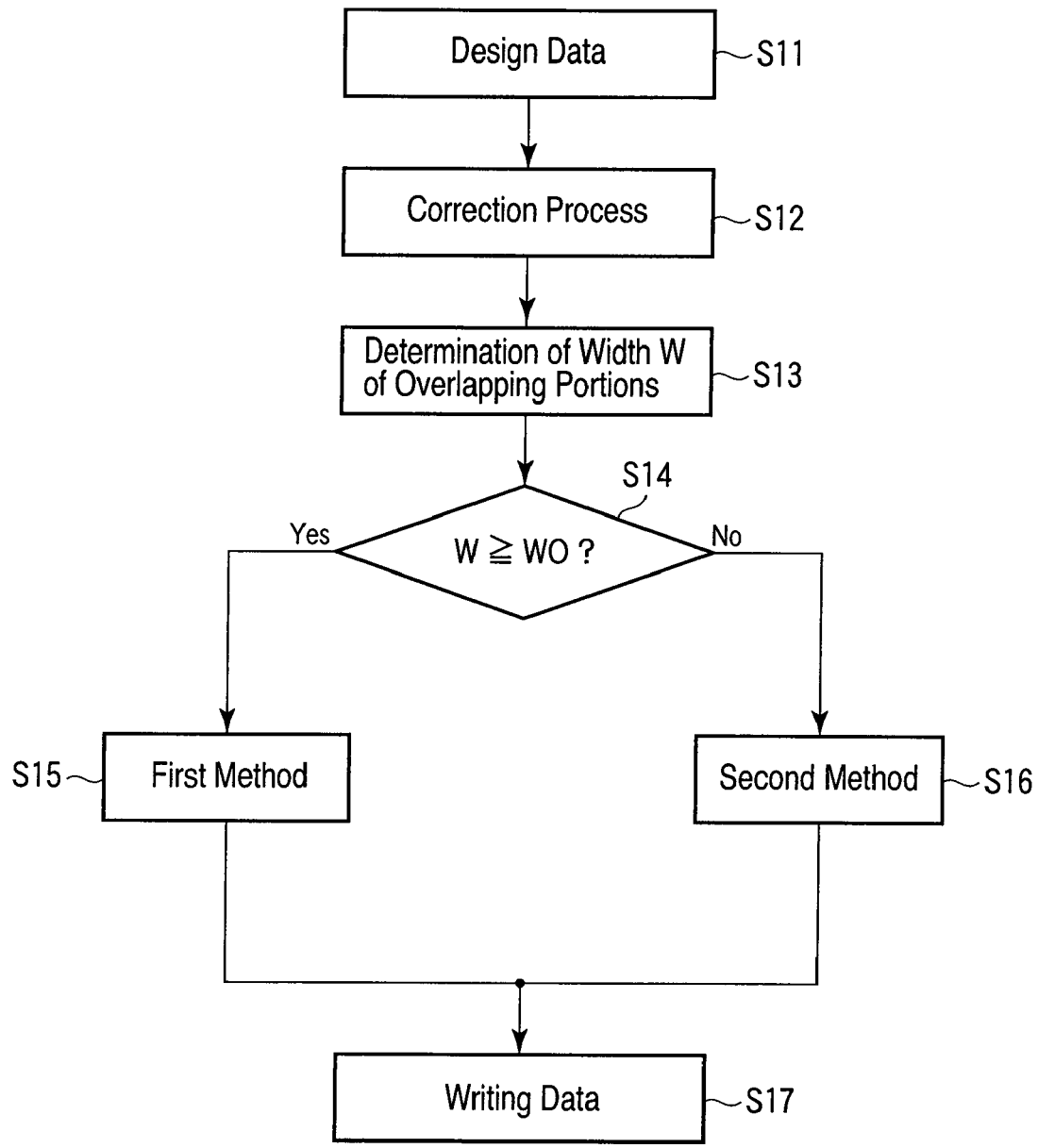
F I G. 1

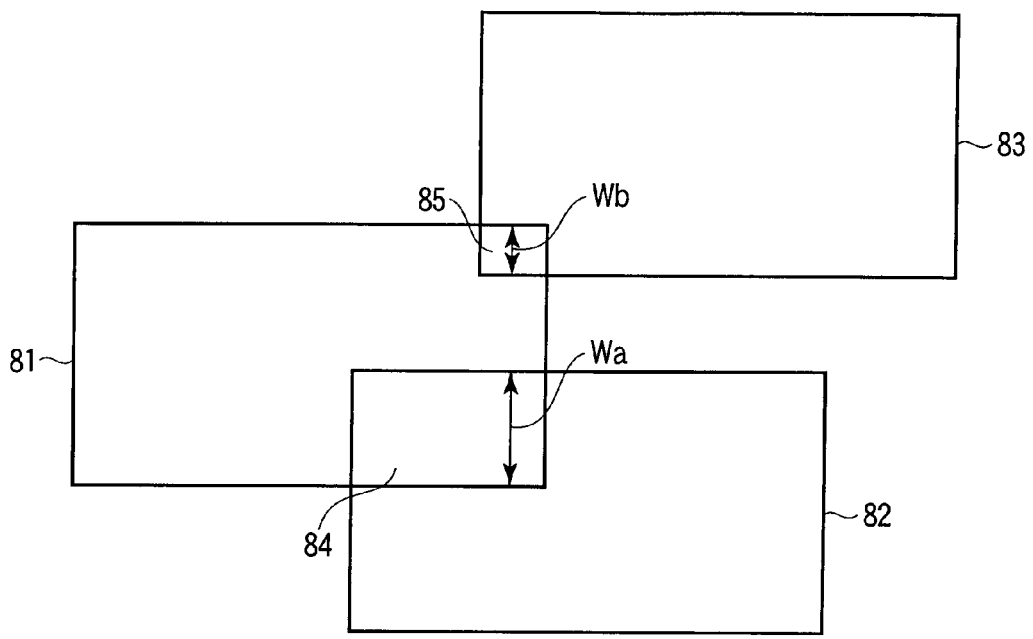
F I G. 13
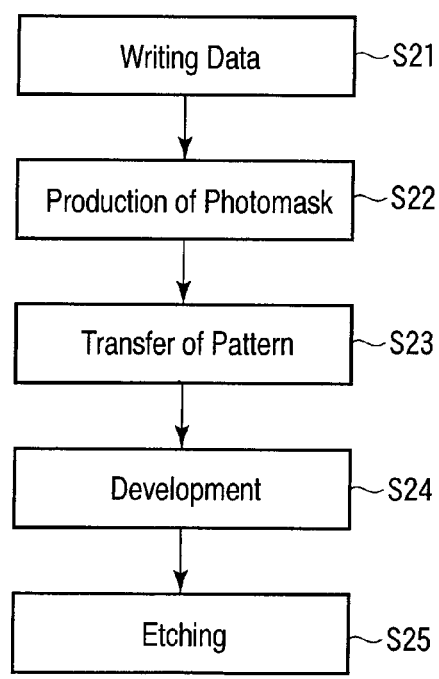
F I G. 14

WRITING PATTERN PRODUCING METHOD, PHOTOMASK MANUFACTURING METHOD, AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2008-240873, filed Sep. 19, 2008, the entire contents of which are incorporated herein by reference.

BACKGROUND OF THE INVENTION

1. Field of the Invention

The present invention relates to a writing pattern producing method, a photomask manufacturing method, and a semiconductor device manufacturing method.

2. Description of the Related Art

As the dimensions of semiconductor devices are scaled down, it becomes increasingly difficult to form patterns on a semiconductor substrate as they are designed. For this reason, in generating data for a mask pattern to be formed on a photomask, assist patterns are added (see Jpn. Pat. Appln. KOKAI Publication No. 2001-313253 and Jpn. Pat. Appln. KOKAI Publication No. 2006-227407). When a writing pattern is produced, it is usually divided into a plurality of graphic forms for writing.

With conventional writing pattern producing methods, however, it cannot necessarily be said that writing patterns are formed accurately.

BRIEF SUMMARY OF THE INVENTION

A first aspect of the present invention, there is provided a writing pattern producing method for writing on a photomask a mask pattern used for forming a circuit pattern on a semiconductor substrate, comprising: obtaining a width of an overlapping portion of first and second patterns on the basis of pattern data for a mask pattern; determining whether the width of the overlapping portion is greater than a predetermined width; producing a writing pattern according to a first method when the width of the overlapping portion is determined to be greater than the predetermined width; producing a writing pattern according to a second method when the width of the overlapping portion is determined to be smaller than the predetermined width; and producing a writing pattern according to either of the first and second methods when the width of the overlapping portion is determined to be equal to the predetermined width, the first method being to produce the writing pattern by dividing a composite pattern of the first and second patterns into a plurality of graphic forms which have widths not smaller than the predetermined width and do not overlap with one another, and the second method being to produce the writing pattern from the first and second patterns so that the overlapping portion is written repeatedly.

A second aspect of the present invention, there is provided a photomask manufacturing method comprising producing a photomask on the basis of the writing pattern produced by the above method.

A third aspect of the present invention, there is provided a semiconductor device manufacturing method comprising transferring a pattern on the photomask manufactured by the above method onto a photoresist on a semiconductor substrate.

BRIEF DESCRIPTION OF THE SEVERAL VIEWS OF THE DRAWING

FIG. 1 is a flowchart illustrating a method according to an embodiment of the present invention;

FIG. 13 is a schematic diagram of a pattern according to another modification of the embodiment of the present invention; and FIG. 14 is a flowchart illustrating a method according to the embodiment of the present invention.

DETAILED DESCRIPTION OF THE INVENTION

An embodiment of the present invention will be described hereinafter with reference to the accompanying drawings.

FIG. 1 is a flowchart illustrating a method according to the embodiment.

Figure 2:
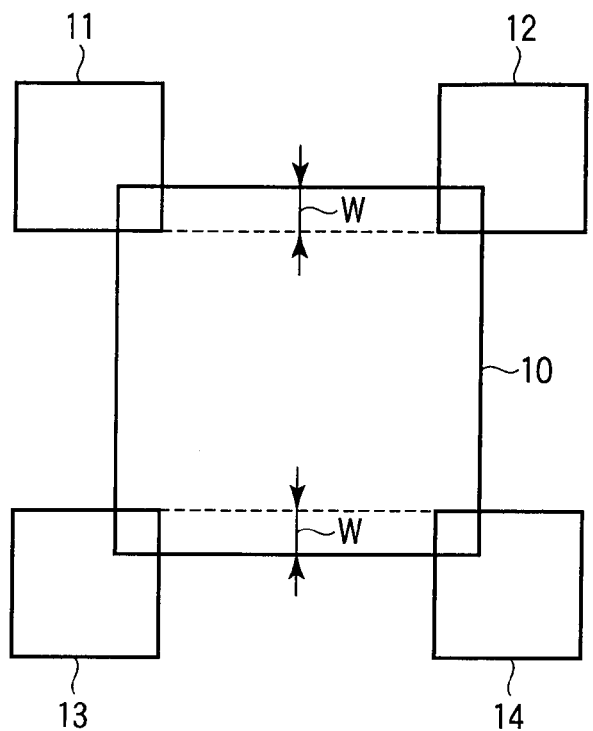
FIG. 2 is a schematic diagram of a pattern with assist patterns according to the embodiment of the present invention.

First, design data for a circuit pattern of a semiconductor integrated circuit device is prepared (S11). Then, assist patterns are set up on and a correction process, such as optical proximity correction (OPC), is carried out on the design data (S12). It is assumed here that the circuit pattern is a hole pattern. The correction process allows such patterns as shown in FIG. 2 to be produced on the basis of the design data. That is, mask pattern data is produced which has a main pattern 10 corresponding to the circuit pattern and assist patterns 11 to 14 adapted for correction of optical proximity effects.

Next, a formatting process is carried out to convert the mask pattern data shown in FIG. 2 to data for use in a writing apparatus. The formatting process will be described below.

First, the width W of the overlapping portions of the main pattern 10 and the assist patterns 11 to 14 in a given direction is determined (S13). Here, the given direction is the up-and-down (vertical) direction in FIG. 2. Subsequently, a decision is made as to whether or not the width W of the overlapping portions is larger than a predetermined width W0 (S14). For example, the width W0 is determined on the basis of the resolution limit of the writing apparatus used in forming a writing pattern produced by the method to be described later on a photomask. The resolution limit is an index which represents a minute graphic size which can be expressed in terms of data, but does not lead to the pattern resolution due to a blur of a beam formed by the writing apparatus. The smaller the resolution limit, the higher the resolution capability. In this embodiment, the value for the resolution limit width is taken to be W0.

Figure 3:
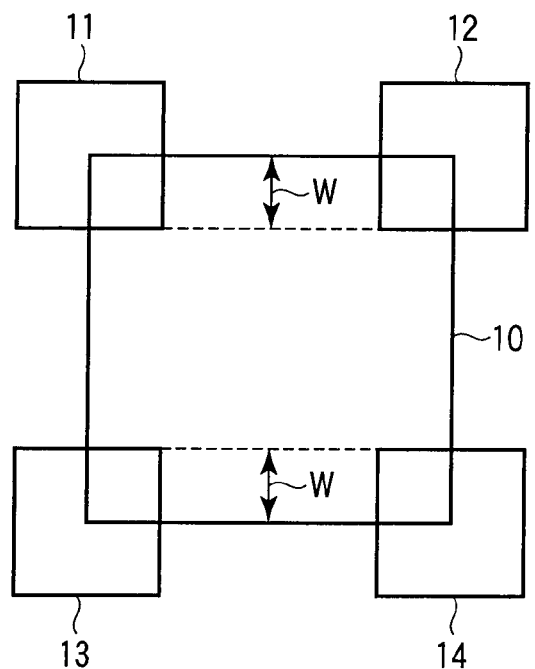
FIG. 3 is a schematic diagram of a pattern with assist patterns according to the embodiment of the present invention.
Figure 4:
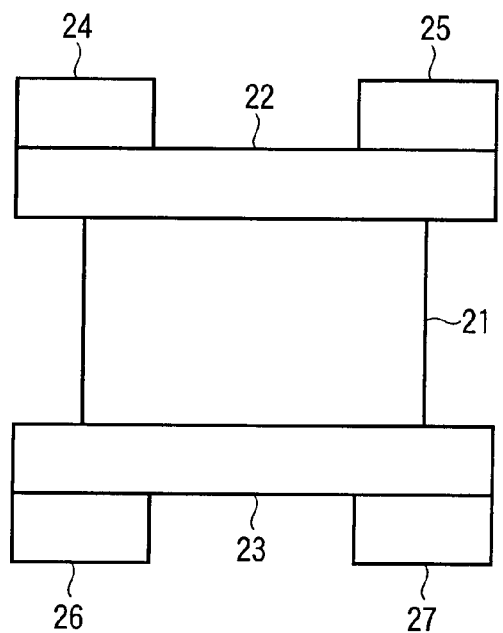
FIG. 4 is a schematic diagram of a writing pattern based on the pattern shown in FIG. 3.

If the decision in step S14 is that the width W of the overlapping portions is W0 or above (W≧W0) as shown in FIG. 3, then writing data is produced by such a first method (as described below S15). That is, in the first method, the writing pattern is produced by dividing a composite pattern of the main pattern 10 and the assist patterns 11 to 14 into a plurality of graphic forms 21 to 27 as shown in FIG. 4. Specifically, the composite pattern is divided into a plurality of rectangular graphic forms 21 to 27 each of which has a width of W0 or above in the given direction (i.e., the vertical direction in FIG. 4). As shown in FIG. 4, the divided graphic forms 21 to 27 are produced so that they do not overlap with one another and adjacent graphic forms contact each other. Each of the divided graphic forms 21 to 27 is written in one shot.

Figure 5:
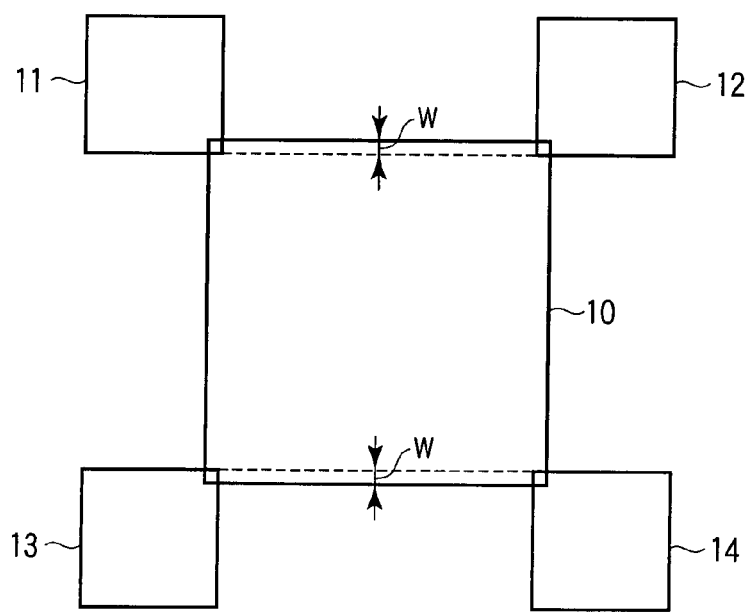
FIG. 5 is a schematic diagram of a pattern with assist patterns according to the embodiment of the present invention.
Figure 6:
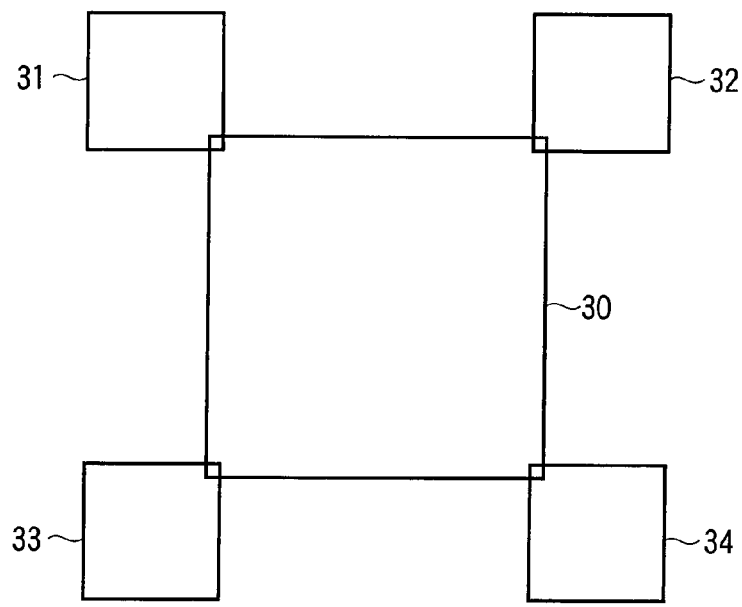
FIG. 6 is a schematic diagram of a writing pattern based on the pattern shown in FIG. 5.

If, on the other hand, the decision in step S14 is that the width W of the overlapping portions is smaller than W0 (W<W0) as shown in FIG. 5, then writing data is produced by such a second method as described below (S16). That is, in the second method, a writing pattern is produced from the main pattern 10 and the assist patterns 11 to 14 so that the overlapping portions are written repeatedly. Specifically, as shown in FIG. 6, a writing pattern is produced which contains a graphic form 30 corresponding to the main pattern 10 and graphic forms 31 to 34 corresponding to the assist patterns 11 to 14. As can be seen from FIGS. 5 and 6, the writing pattern shown in FIG. 6 has overlapping portions corresponding to the pattern overlapping portions shown in FIG. 5. An additional description is given below.

Figure 7:
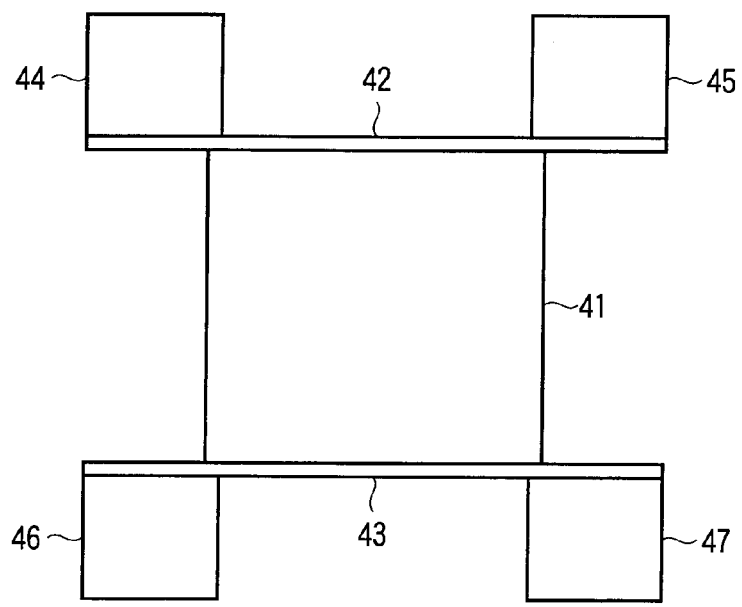
FIG. 7 shows an inappropriate example of a writing pattern based on the pattern shown in FIG. 5.

Suppose, for example, that a writing pattern is produced using the first method even when the width W of the overlapping portions is smaller than W0. In that case, a composite pattern of the main pattern 10 and the assist patterns 11 to 14 is divided, as shown in FIG. 7, into a plurality of graphic forms 41 to 47. The width of the graphic forms 42 and 43 is W, smaller than W0. Assuming, for example, that W0 is the resolution limit width, it is therefore difficult to write the graphic forms 42 and 43 in the proper width. As a result, there arises a problem that a gap is produced in the boundary between, for example, the graphic form 42 and a graphic form adjacent to it (graphic form 41, 44, or 45). For this reason, a proper writing pattern could not be obtained. When the width W of the overlapping portions is smaller than W0, therefore, the second method is used to produce a writing pattern which includes graphic forms 30 to 34 as shown in FIG. 6. With the second method, however, the graphic form 30 overlaps with each of its adjacent graphic forms 31, 32, 33 and 34 as shown in FIG. 6. In this case, however, since the width of the overlapping portions is small, no serious problem will occur. This point is described below.

The overlapping portions are excessively irradiated with an electron beam because writing is carried out repeatedly. For this reason, it is usually difficult to form desired patterns in the overlapping portions. However, if the overlapping portions are very small, it is possible to avoid such a problem. That is, in electron beam lithography, edge portions (in particular, corner portions) are generally rounded. For this reason, the area of an overlapping portion produced by actual electron beam lithography becomes smaller than that of overlapping portion defined in terms of writing pattern data. Accordingly, if the overlapping portion is small, it becomes possible to reduce adverse effects of repeated writing.

Thus, writing pattern data can be obtained by one of the first and second methods which is selected according to the width W of the overlapping portions (S17).

Figure 8:
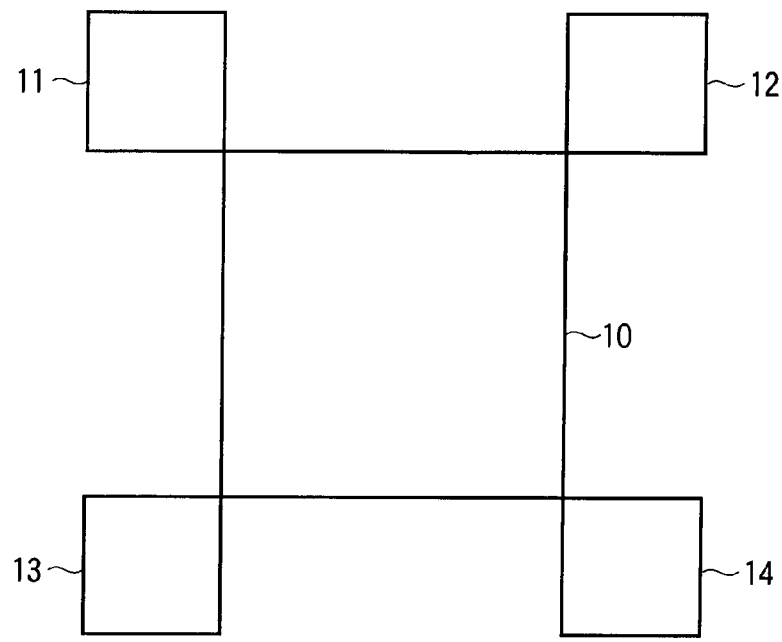
FIG. 8 is a schematic diagram of a pattern with assist patterns according to the embodiment of the present invention.
Figure 9:
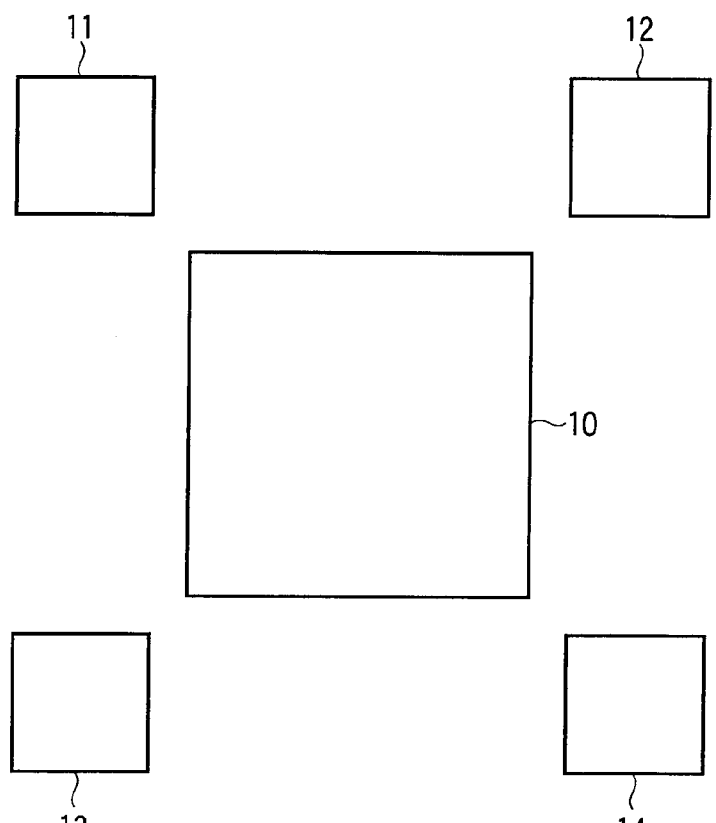
FIG. 9 is a schematic diagram of a pattern with assist patterns according to the embodiment of the present invention.

If there is no overlap between the main pattern 10 and each of the assist patterns 11 to 14 as shown in FIG. 8 or 9, it is only required to produce a writing pattern having graphic forms corresponding to the patterns 10 to 14.

According to the present embodiment, as described above, an accurate writing pattern can be produced by producing writing pattern data using a method selected according to the width of overlapping portions.

Figure 11:
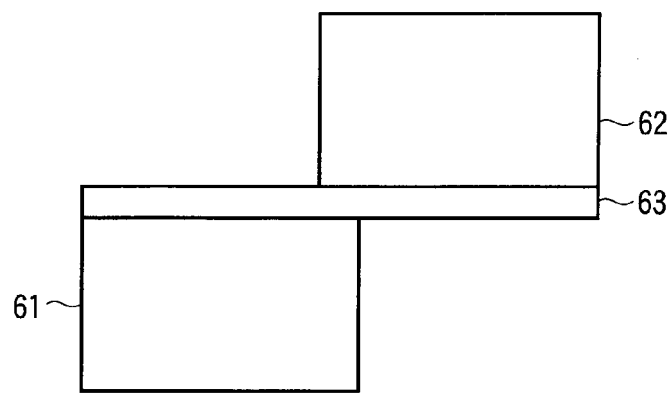
FIG. 11 schematically shows a writing pattern based on the pattern shown in FIG. 10.
Figure 12:
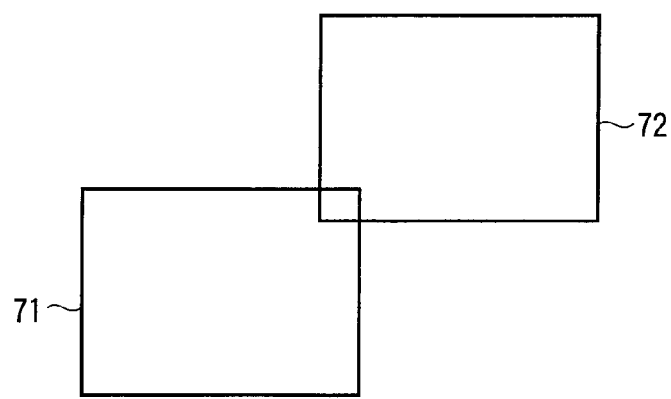
FIG. 12 schematically shows a writing pattern based on the pattern shown in FIG. 10.

Next, modifications of the present embodiment will be described with reference to FIGS. 10, 11 and 12.

Figure 10:
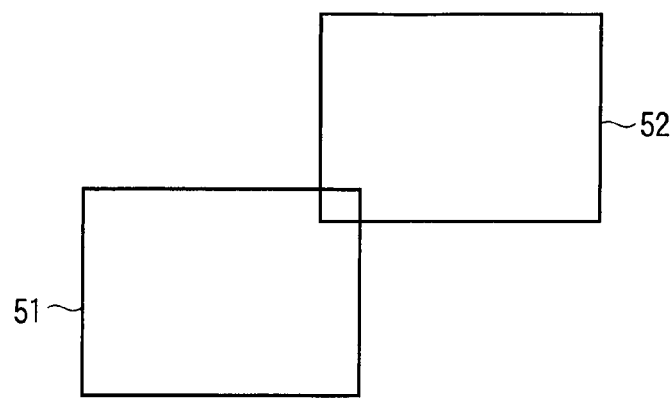
FIG. 10 schematically shows a pattern according to a modification of the embodiment of the present invention.

The embodiment has been described taking a pattern having the main pattern 10 and the assist patterns 11 to 14 by way of example; however, it is also possible to use the above-stated methods of the embodiment even in the case where two or more patterns 51 and 52 corresponding to circuit patterns overlap with each other as shown in FIG. 10. That is, as with the above-mentioned embodiment, the width W of the overlapping portion of the patterns 51 and 52 in the given direction (the vertical direction in FIG. 10) is determined. When W≧W0, a writing pattern is produced using the first method. That is, as shown in FIG. 11, a composite pattern of the patterns 51 and 52 is divided into three graphic forms 61, 62 and 63. If, on the other hand, W<W0, the second method is used to produce a writing pattern. That is, as shown in FIG. 12, a writing pattern is produced which contains a graphic form 71 corresponding to the pattern 51 and a graphic form 72 corresponding to the pattern 52.

Even with the above-mentioned modification, it becomes possible to produce an accurate writing pattern by producing writing pattern data using a method selected according to the width of overlapping portions.

FIG. 13 shows another modification of the present embodiment. In the example shown in FIG. 13, three patterns 81, 82 and 83 are set in close proximity to one another so that the patterns 81 and 82 overlap with each other and the patterns 81 and 83 overlap with each other. The width Wa of the overlapping portion 84 of the patterns 81 and 82 is W0 or above and the width Wb of the overlapping portion 85 of the patterns 81 and 83 is smaller than W0. In such a case, it is merely required to produce writing pattern data using the first method in an area containing the overlapping portion 84 and writing pattern data using the second method in an area containing the overlapping portion 85. Even in the above case, it becomes possible to produce an accurate writing pattern by producing writing pattern data using a method selected according to the width of overlapping portions.

In the embodiment and the modifications described above, the first method is used to produce writing pattern data when the width W of the overlapping portion is the preset width W0 or above (W≧W0), while the second method is used when the width W of the overlapping portion is less than W0 (W<W0). However, it is also possible to use the first method when the width W of the overlapping portion is larger than W0 (W>W0) or the second method when the width W of the overlapping portion is W0 or below (W≦W0).

FIG. 14 is a flowchart illustrating a photomask manufacturing method and a semiconductor device manufacturing method based on a writing pattern produced by the method according to the embodiment.

Writing pattern data produced by the method of the present embodiment is first prepared (S21). A photomask is then manufactured by writing on it on the basis of the writing pattern data (S22). Next, the pattern written on the photomask thus manufactured is transferred onto a photoresist formed over a semiconductor substrate (S23). The photoresist is then developed to form a resist pattern (S24). Using the resist pattern thus formed as a mask, a conducting layer or insulating layer formed over the semiconductor substrate is etched into a desired pattern (S25).

Thus, it becomes possible to obtain a photomask having an accurate pattern and form a desired pattern on a semiconductor substrate by producing accurate writing pattern data using the method according to the present embodiment.

The above-stated method of the embodiment can be implemented by a computer the operation of which is controlled by a program that describes the procedure of the method. The program can be provided via a recording medium, such as a magnetic disk, or communication lines (cable or wireless communication lines), such as the Internet. Specifically, a procedure based on desired steps or a combination of desired steps of the method described in the embodiment can be described in the program.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing pattern producing method for writing on a photomask a mask pattern used for forming a circuit pattern on a semiconductor substrate, comprising:
   obtaining, by a computer, a width of an overlapping portion of first and second patterns on the basis of pattern data for a mask pattern;
   determining, by a computer, whether the width of the overlapping portion is greater than a predetermined width;
   producing, by a computer, a writing pattern according to a first method when the width of the overlapping portion is determined to be greater than the predetermined width;
   producing, by a computer, a writing pattern according to a second method when the width of the overlapping portion is determined to be smaller than the predetermined width; and
   producing, by a computer, a writing pattern according to either of the first and second methods when the width of the overlapping portion is determined to be equal to the predetermined width,
   the first method being to produce the writing pattern by dividing a composite pattern of the first and second patterns into a plurality of graphic forms which have widths not smaller than the predetermined width and do not overlap with one another, and
   the second method being to produce the writing pattern from the first and second patterns so that the overlapping portion is written repeatedly.

2. The method according to claim 1, wherein the predetermined width is determined on the basis of a resolution capability of a writing apparatus used in writing the produced writing pattern on the photomask.

3. The method according to claim 1, wherein one of the first and second patterns is an assist pattern.

4. The method according to claim 3, wherein the other of the first and second patterns is a pattern corresponding to a circuit pattern to be formed on a semiconductor substrate.

5. The method according to claim 1, wherein the pattern data for the mask pattern is obtained by carrying out a correction process on design data for a circuit pattern to be formed on a semiconductor substrate.

6. The method according to claim 5, wherein the correction process includes an optical proximity correction.

7. The method according to claim 1, wherein the width of the overlapping portion is a width in a predetermined direction.

8. The method according to claim 1, wherein the composite pattern of the first and second patterns is divided into the graphic forms in a predetermined direction.

9. The method according to claim 1, wherein each of the graphic forms is rectangular in shape.

10. The method according to claim 1, wherein each of the graphic forms is written in one shot.

11. The method according to claim 1, wherein the writing pattern produced by the second method includes a graphic form corresponding to the first pattern and a graphic form corresponding to the second pattern.

12. The method according to claim 1, wherein each of the first and second patterns is a pattern corresponding to a circuit pattern to be formed on a semiconductor substrate.

13. The method according to claim 1, wherein the writing pattern is an electron beam writing pattern.

14. A photomask manufacturing method comprising producing a photomask on the basis of the writing pattern produced by the method according to claim 1.

15. A semiconductor device manufacturing method comprising transferring a pattern on the photomask manufactured by the method according to claim 14 onto a photoresist on a semiconductor substrate.

* * * * *